United States Patent
Morikazu

(10) Patent No.: US 10,483,149 B2
(45) Date of Patent: Nov. 19, 2019

(54) WAFER PROCESSING METHOD FOR DIVIDING A WAFER, INCLUDING A SHIELD TUNNEL FORMING STEP

(71) Applicant: DISCO CORPORATION, Tokyo (JP)

(72) Inventor: Hiroshi Morikazu, Tokyo (JP)

(73) Assignee: DISCO CORPORATION, Tokyo (JP)

(*) Notice: Subject to any disclaimer, the term of this patent is extended or adjusted under 35 U.S.C. 154(b) by 0 days.

(21) Appl. No.: 16/059,238

(22) Filed: Aug. 9, 2018

(65) Prior Publication Data

US 2019/0057892 A1   Feb. 21, 2019

(30) Foreign Application Priority Data

Aug. 17, 2017  (JP) ................. 2017-157328

(51) Int. Cl.
| | |
|---|---|
| *H01L 21/78* | (2006.01) |
| *B23K 26/55* | (2014.01) |
| *B23K 26/53* | (2014.01) |
| *H01L 21/3065* | (2006.01) |
| *H01L 21/268* | (2006.01) |
| *H01L 21/67* | (2006.01) |

(Continued)

(52) U.S. Cl.
CPC ........ *H01L 21/6836* (2013.01); *B23K 26/362* (2013.01); *B23K 26/53* (2015.10); *B23K 26/55* (2015.10); *H01L 21/268* (2013.01); *H01L 21/3065* (2013.01); *H01L 21/67092* (2013.01); *H01L 21/78* (2013.01); *H01L 2221/68327* (2013.01); *H01L 2221/68381* (2013.01)

(58) Field of Classification Search
CPC .............. B23K 26/53; B23K 26/55; H01L 21/3065–30655; H01L 21/78
See application file for complete search history.

(56) References Cited

U.S. PATENT DOCUMENTS

| | | | |
|---|---|---|---|
| 9,209,591 B2 | 12/2015 | Takeda et al. | |
| 2013/0059428 A1* | 3/2013 | Arai | ......... H01L 21/78 438/462 |

(Continued)

FOREIGN PATENT DOCUMENTS

| | | |
|---|---|---|
| JP | 10305420 A | 11/1998 |
| JP | 2002192370 A | 7/2002 |
| JP | 2014221483 A | 11/2014 |

OTHER PUBLICATIONS

Morikazu et al., U.S. Appl. No. 16/025,037, filed Jul. 2, 2019.

*Primary Examiner* — Daniel Luke
(74) *Attorney, Agent, or Firm* — Greer Burns & Crain, Ltd.

(57) ABSTRACT

A wafer processing method includes: a protective member placing step of placing a protective member on the face side of a wafer; a shield tunnel forming step of applying a laser beam, which has a wavelength that is transmittable through single-crystal silicon, to areas of the wafer that correspond to projected dicing lines from a reverse side of the wafer, thereby successively forming a plurality of shield tunnels in the wafer, each including a fine pore extending from the reverse side to the face side of the wafer and an amorphous region surrounding the fine pore; and a dividing step of dividing the wafer into individual device chips by etching the shield tunnels according to plasma etching. The pulsed laser beam used in the shield tunnel forming step has a wavelength of 1950 nm or higher.

6 Claims, 5 Drawing Sheets

(51) Int. Cl.
 *H01L 21/683* (2006.01)
 *B23K 26/362* (2014.01)

(56) References Cited

U.S. PATENT DOCUMENTS

2014/0334511 A1* 11/2014 Takeda ............... H01S 3/10
 372/41
2019/0009373 A1 1/2019 Morikazu et al.

* cited by examiner

WAFER PROCESSING METHOD FOR DIVIDING A WAFER, INCLUDING A SHIELD TUNNEL FORMING STEP

BACKGROUND OF THE INVENTION

Field of the Invention

The present invention relates to a wafer processing method for dividing a wafer including a single-crystal silicon substrate having on a face side thereof a plurality of devices disposed in respective areas demarcated by a plurality of intersecting projected dicing lines, into individual device chips that support the respective devices thereon.

Description of the Related Art

Wafers having a plurality of devices such as integrated circuits (ICs), large scale integration (LSI) circuits, or the like on a face side thereof in respective areas demarcated by a plurality of intersecting projected dicing lines are divided into individual device chips that support the respective devices thereon by a laser processing apparatus. The divided device chips will be used in electric appliances such as mobile phones, personal computers, and so on.

Laser processing apparatus of the following types (1) through (3) are available in the art:

(1) The type in which a laser beam having a wavelength that can be absorbed by a workpiece is applied to the workpiece while keeping its focused spot on an upper surface of the workpiece, forming grooves serving as division initiating points in the workpiece according to an ablation process (see, for example, Japanese Patent Laid-open No. 1998-305420).

(2) The type in which a laser beam having a wavelength that can be transmitted through a workpiece is applied to the workpiece while keeping its focused spot within the workpiece, forming modified layers serving as division initiating points in the workpiece (see, for example, Japanese Patent No. 3408805).

(3) The type in which a laser beam having a wavelength that can be transmitted through a workpiece is applied to the workpiece while keeping its focused spot within the workpiece, forming a plurality of shield tunnels serving as division initiating points, each made up of a fine pore extending from the face side to reverse side of the workpiece and an amorphous region surrounding the fine pore (see, for example, Japanese Patent Laid-open No. 2014-221483).

SUMMARY OF THE INVENTION

When a wafer that has been processed by a process according to the types (2) or (3) referred to above to form division initiating points in the wafer is divided into individual device chips by plasma etching, the produced device chips have a high flexural strength.

According to the technology disclosed in Japanese Patent Laid-open No. 2014-221483, shield tunnels can properly be formed in a wafer made of sapphire ($Al_2O_3$), silicon carbide (SiC), or gallium arsenide (GaN). However, shield tunnels cannot properly be formed in a wafer made of single-crystal silicon. Therefore, a single-crystal silicon wafer cannot be divided into individual device chips by a combination of shield tunnel formation and plasma etching.

The technology disclosed in Japanese Patent No. 3408805 is able to form modified layers in a single-crystal silicon wafer along projected dicing lines thereon. In the case where a metal film of test element group (TEG) or the like or an insulator film of a low dielectric constant referred to as a low-k film is deposited on the upper surface of projected dicing lines, however, a single-crystal silicon wafer cannot be divided into individual device chips by a combination of modified layer formation and plasma etching.

If proper shield tunnels can be formed in a single-crystal silicon wafer, then since fine pores can be formed in a metal layer or a low-k film deposited on the upper surface of projected dicing lines, a single-crystal silicon wafer can be divided into individual device chips by a combination of shield tunnel formation and plasma etching.

It is therefore an object of the present invention to provide a laser processing method which is capable of forming proper shield tunnels in a single-crystal silicon wafer to divide the single-crystal silicon wafer into individual device chips according to a combination of shield tunnel formation and plasma etching.

In accordance with an aspect of the present invention, there is provided a wafer processing method for dividing a wafer including a single-crystal silicon substrate having on a face side thereof a plurality of devices disposed in respective areas demarcated by a plurality of intersecting projected dicing lines, into individual device chips. The method includes: a protective member placing step of placing a protective member on the face side of the wafer; a shield tunnel forming step of, after performing the protective member placing step, applying a laser beam, which has a wavelength that is transmittable through single-crystal silicon, to areas of the wafer that correspond to the projected dicing lines from a reverse side of the wafer, thereby successively forming a plurality of shield tunnels in the wafer, each including a fine pore extending from the reverse side to the face side of the wafer and an amorphous region surrounding the fine pore; and a dividing step of, after performing the shield tunnel forming step, dividing the wafer into individual device chips by etching the shield tunnels according to plasma etching. The pulsed laser beam used in the shield tunnel forming step has a wavelength of 1950 nm or higher.

Preferably, in the shield tunnel forming step, the pulsed laser beam is focused by a condensing lens having a numerical aperture set such that a value calculated by dividing the numerical aperture of the condensing lens by the refractive index of single-crystal silicon is in a range of 0.05 to 0.2.

According to the present invention, since the wavelength of the laser beam used in the shield tunnel forming step is set to 1950 nm or higher, proper shield tunnels can be formed in the wafer along the projected dicing lines. The amorphous region surrounding each of the fine pores of the shield tunnels has a higher etching rate than the single-crystal silicon which the substrate of the wafer is made of, the shield tunnels formed along the projected dicing lines are etched by a combination of shield tunnel formation and plasma etching, thereby dividing the wafer into individual device chips having the respective devices thereon. The device chips have a high flexural strength. Even if a metal film or a low-k film is deposited on the upper surfaces of the projected dicing lines, a number of fine pores are formed as perforations in the metal film or the low-k film in the shield tunnel forming step. Therefore, when external forces are applied to the wafer by suitable external force applying means, the metal film or the low-k film is severed along the fine pores in the form of perforations, so that the wafer can be divided into individual device chips having the respective devices thereon.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
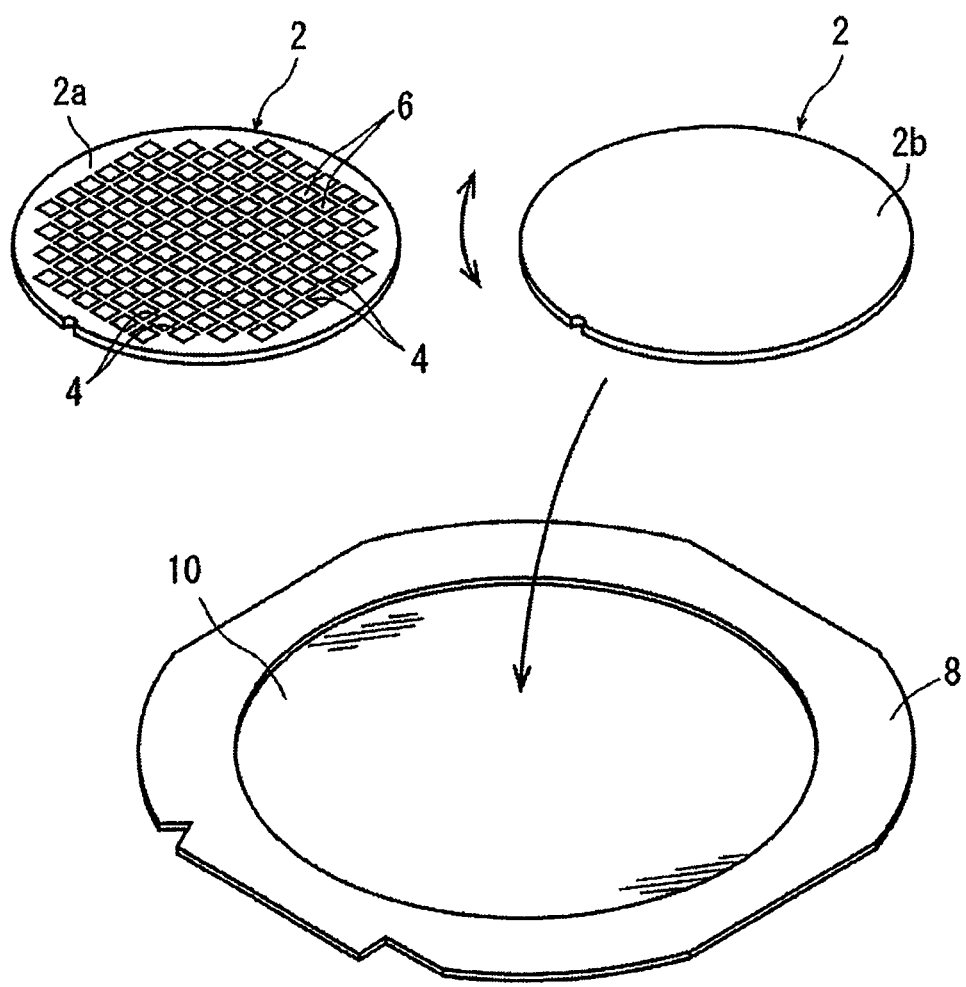
FIG. 1 is a perspective view of a wafer and a protective member, illustrating the manner in which a protecting member placing step is being carried out.

A wafer processing method according to an embodiment of the present invention will be described below with reference to the drawings. FIG. 1 is a perspective view of a wafer 2 that is to be processed by the wafer processing method according to the present embodiment. The wafer 2, which includes a disk-shaped single-crystal silicon substrate, has a face side 2a demarcated by a grid of projected dicing lines 4 into a plurality of rectangular areas with devices 6 such as ICs, LSI circuits, or the like formed in the respective rectangular areas.

In the wafer processing method according to the present embodiment, a protective member placing step is initially carried out to place a protective member on the face side 2a of the wafer 2. According to the present embodiment, a protective tape 10 whose peripheral edge portion fixed to an annular frame 8 is stuck as the protective member to the face side 2a of the wafer 2.

After the protective member placing step, a shield tunnel forming step is carried out to successively form a plurality of shield tunnels, each made up of a fine pore extending from a reverse side 2b to the face side 2a of the wafer 2 and an amorphous region surrounding the fine pore, in the wafer 2 by applying a laser beam having a wavelength that can be transmitted through single-crystal silicon to portions of the wafer 2 that correspond to the respective projected dicing lines 4 from the reverse side 2b of the wafer 2. The shield tunnel forming step may be carried out using a laser processing apparatus 12 depicted in FIG. 2, for example.

Figure 2:
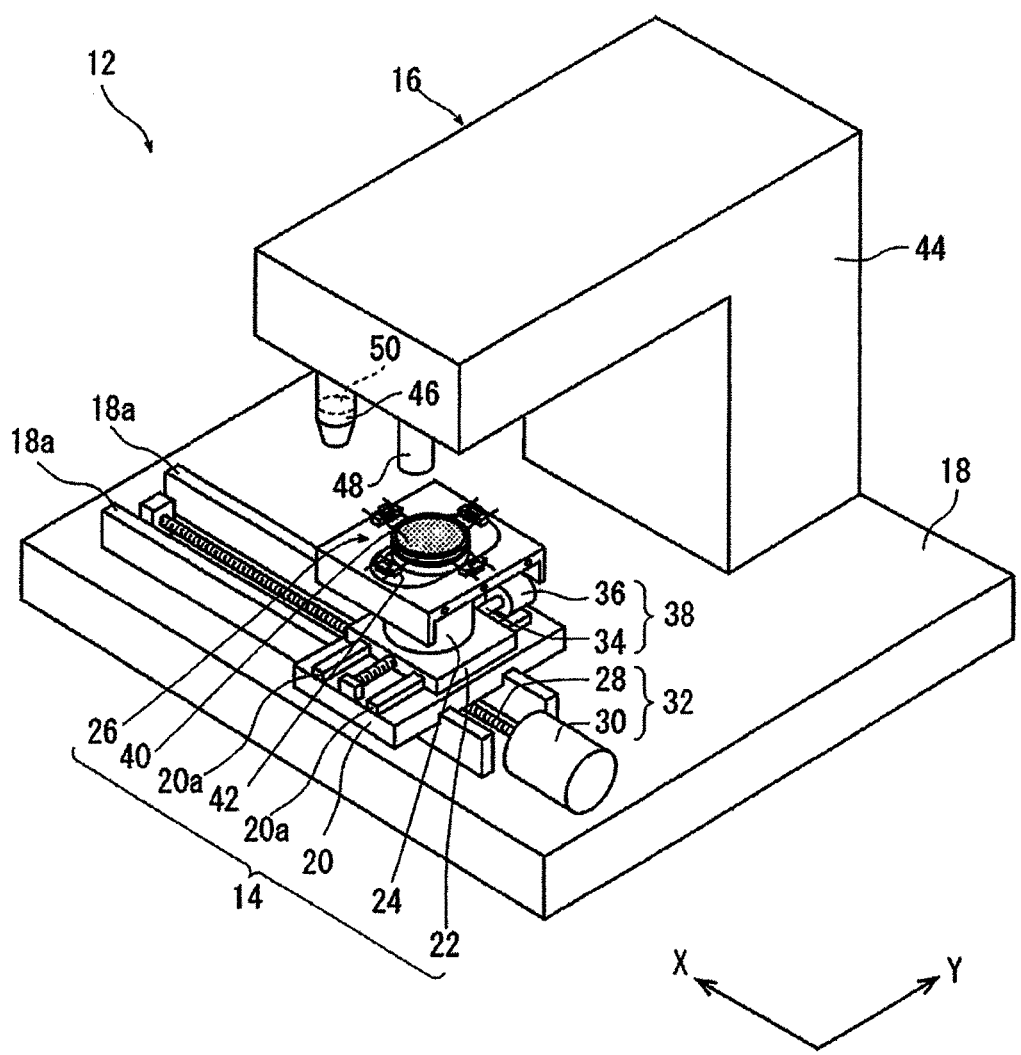
FIG. 2 is a perspective view of a laser processing apparatus.

As depicted in FIG. 2, the laser processing apparatus 12 includes a holding unit 14 for holding a workpiece such as the wafer 2 or the like thereon, and a laser beam applying unit 16 for applying the laser beam to the workpiece held on the holding unit 14. The holding unit 14 includes an X-axis movable plate 20 mounted on a base 18 for movement in X-axis directions, a Y-axis movable plate 22 mounted on the X-axis movable plate 20 for movement in Y-axis directions, a post 24 fixed to an upper surface of the Y-axis movable plate 22, and a chuck table 26 rotatably mounted on an upper end the post 24.

The X-axis movable plate 20 is movable in the X-axis directions along guide rails 18a on the base 18 by an X-axis moving unit 32 that has a ball screw 28 extending in the X-axis directions and an electric motor 30 coupled to an end of the ball screw 28. The Y-axis movable plate 22 is movable in the Y-axis directions along guide rails 20a on the X-axis movable plate 20 by a Y-axis moving unit 38 that has a ball screw 34 extending in the Y-axis directions and an electric motor 36 coupled to an end of the ball screw 34. The chuck table 26 is rotatable about its own central axis by a rotating unit, not depicted, housed in the post 24. The chuck table 26 supports on its upper surface a porous suction chuck 40 connected to suction means, not depicted. The chuck table 26 holds the workpiece under suction on the suction chuck 40 with suction forces generated by the suction means and acting on the upper surface of the suction chuck 40. As depicted in FIG. 2, a plurality of clamps 42 for securing the outer peripheral edge of the annular frame 8 to the peripheral edge of the suction chuck 40 are disposed at circumferentially spaced intervals around the peripheral edge of the chuck table 26. The X-axis directions refer to the direction indicated by the arrow X in FIG. 2 and a direction opposite thereto, and the Y-axis directions refer to the direction indicated by the arrow Y in FIG. 2 and a direction opposite thereto and are perpendicular to the X-axis directions. The X-axis directions and the Y-axis directions jointly define a substantially horizontal X-Y plane.

Figure 3:
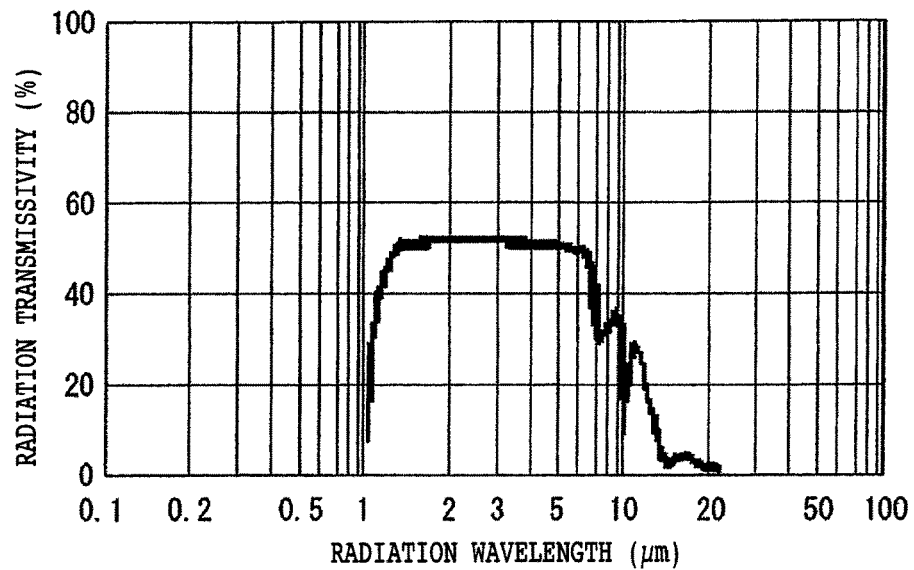
FIG. 3 is a graph depicting a general relation between the radiation transmittivity of single-crystal silicon and the wavelength of a radiation.

The laser beam applying unit 16 of the laser processing apparatus 12 includes a frame 44 extending upwardly from an upper surface of the base 18 and then extending substantially horizontally parallel to the upper surface of the base 18 in overhanging relation to the holding unit 14. The frame 44 houses therein a laser oscillator, not depicted, for oscillating a pulsed laser beam LB having a wavelength of 1950 nm or higher that is transmittable through single-crystal silicon. As depicted in FIG. 3, generally, the radiation transmittivity of single-crystal silicon increases as the wavelength of a radiation applied thereto increases from a radiation wavelength of approximately 1050 nm at an end of the optical absorption spectrum of single-crystal silicon, has a substantially constant level of approximately 55% in a radiation wavelength range from approximately 1200 to 6000 nm, and decreases as the wavelength of a radiation applied thereto increases in a radiation wavelength range exceeding approximately 6000 nm.

The laser beam applying unit 16 will further be described below with reference to FIG. 2. On the lower surface of a distal end of the frame 44, there are mounted a beam condenser 46 for applying the pulsed laser beam LB to the workpiece held on the chuck table 26 and an image capturing unit 48 for capturing an image of the workpiece held on the chuck table 26 and detecting an area of the workpiece to be processed by the pulsed laser beam LB. The beam condenser 46 and the image capturing unit 48 are spaced from each other along the X-axis directions. The beam condenser 46 includes a condensing lens 50 for focusing the pulsed laser beam LB emitted from the laser oscillator. According to the present embodiment, the condensing lens 50 of the beam condenser 46 has a numerical aperture NA set such that a value S (S=NA/n) calculated by dividing the numerical aperture NA by the refractive index n of single-crystal silicon is in the range from 0.05 to 0.2 ($0.05 \leq S \leq 0.2$). The refractive index n of single-crystal silicon is normally of approximately 3.7, and, providing the refractive index n of single-crystal silicon is of 3.7, the numerical aperture NA of the condensing lens 50 is in the range from 0.185 to 0.74 (0.185≤NA≤0.74). The image capturing unit 48 includes an ordinary image capturing device (charge coupled device (CCD)) for capturing an image of the workpiece with visible light, an infrared ray applying unit for applying infrared rays to the workpiece, an optical system for catching the infrared rays applied by the infrared ray applying unit, and an image capturing device (infrared CCD) for outputting an electric signal corresponding to the infrared rays caught by the optical system. These components of the image capturing unit 48 are omitted from illustration in FIG. 2.

In preparation for the shield tunnel forming step using the above laser processing apparatus 12, the wafer 2 with the reverse side 2b facing upwardly is attracted under suction to the upper surface of the suction chuck 40, and the outer peripheral edge of the annular frame 8 is fixed in place to the peripheral edge of the suction chuck 40 by the clamps 42. Then, the image capturing unit 48 captures an image of the wafer 2 from above. Based on the image of the wafer 2 thus captured by the image capturing unit 48, the X-axis moving unit 32, the Y-axis moving image 38, and the rotating unit are actuated to move and rotate the chuck table 26 to orient the grid of projected dicing lines 4 along the X-axis directions and the Y-axis directions and to position the beam condenser 46 over an end of one of the projected dicing lines 4 that are oriented along the X-axis directions. At this time, the reverse side 2b of the wafer 2 faces upwardly whereas the face side 2a thereof on which the projected dicing lines 4 are formed face downwardly. Since the image capturing unit 48 includes the infrared ray applying unit for applying infrared rays, the optical system for catching the infrared rays, and the image capturing device (infrared CCD) for outputting an electric signal corresponding to the infrared rays, the image capturing unit 48 can capture an image of the projected dicing lines 4 on the face side 2a from the reverse side 2b through the wafer 2. Then, a focused spot position adjusting unit, not depicted, of the laser processing apparatus 12 operates to position the focused spot of the pulsed laser beam LB in the wafer 2 at an area which corresponds to the projected dicing line 4.

Figure 4:
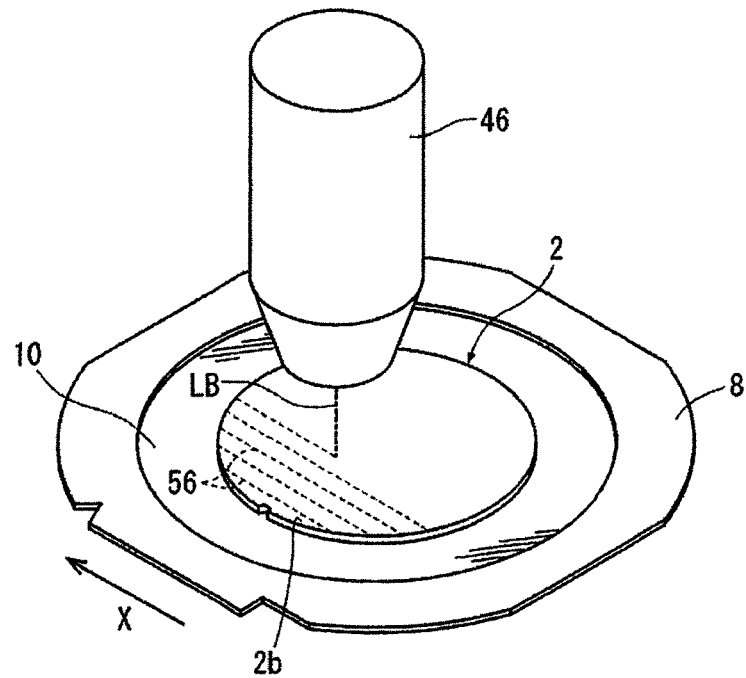
FIG. 4 is a perspective view illustrating the manner in which a shield tunnel forming step is being carried out.
Figure 5A:
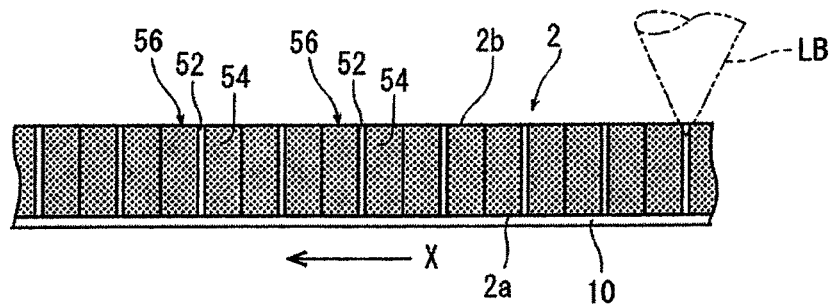
FIG. 5A is an enlarged fragmentary cross-sectional view of the wafer with shield tunnels formed therein.
Figure 5B:
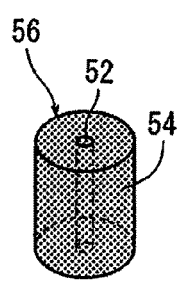
FIG. 5B is a perspective view of a shield tunnel.

Then, as depicted in FIG. 4, while the X-axis moving unit 32 is moving the chuck table 26 in one of the X-axis directions, i.e., in the direction indicated by the arrow X, at a predetermined feed speed with respect to the focused spot of the pulsed laser beam LB, the shield tunnel forming step is carried out to apply the pulsed laser beam LB, which has the wavelength that is transmittable through single-crystal silicon, to the area of the wafer 2 corresponding to the projected dicing line 4 from the reverse side 2b of the wafer 2. As a result of the shield tunnel forming step, there are successively formed a number of shield tunnels 56 (see FIGS. 5A and 5B) in the wafer 2 along the projected dicing line 4, each shield tunnel 56 being made up of a fine pore 52 extending from the reverse side 2b to the face side 2a of the wafer 2 and an amorphous region 54 surrounding the fine pore 52. Then, the wafer 2 is indexing-fed in one of the Y-axis directions, i.e., in the direction indicated by the arrow Y in FIG. 2. Specifically, the Y-axis moving unit 38 moves the chuck table 26 in one of the Y-axis directions, i.e., in the direction indicated by the arrow Y in FIG. 2, by a distance equal to the interval between two adjacent projected dicing lines 4, with respect to the focused spot of the pulsed laser beam LB. The shield tunnel forming step and the indexing-feeding of the wafer 2 are alternately repeated until the shield tunnel forming step is carried out on all of the projected dicing lines 4 that extend parallel to the X-axis directions. Then, the rotating unit turns the chuck table 26 about its central axis by 90 degrees, after which the shield tunnel forming step and the indexing-feeding of the wafer 2 are alternately repeated until the shield tunnel forming step is carried out on all of the projected dicing lines 4 that extend perpendicularly to those projected dicing lines 4 along which the shield tunnel forming step has been carried out. In this manner, the shield tunnels 56 are formed in the wafer 2 along all the projected dicing lines 4 in the grid pattern.

In the shield tunnel forming step, it is important that the wavelength of the pulsed laser beam LB used be set to a value equal to or higher than 1950 nm. As the laser oscillator of the laser processing apparatus 12 according to the present embodiment oscillates the pulsed laser beam LB having the wavelength of 1950 nm or higher that is transmittable through single-crystal silicon, the laser processing apparatus 12 is capable of forming proper shield tunnels 56 in the wafer 2 that includes a single-crystal silicon substrate. In the shield tunnel forming step, the numerical aperture NA of the condensing lens 50 of the beam condenser 46 for focusing the pulsed laser beam LB is set such that the value S calculated by dividing the numerical aperture NA by the refractive index n of single-crystal silicon is in the range from 0.05 to 0.2 (0.05≤S≤0.2).

Figure 6:
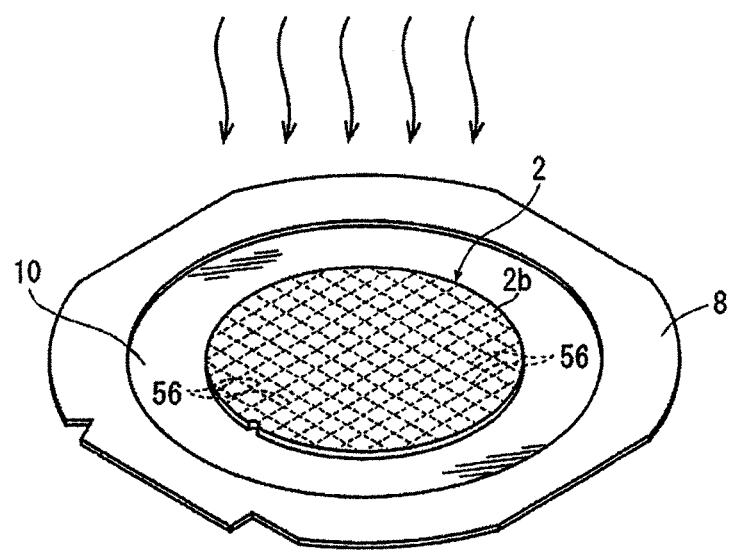
FIG. 6 is a perspective view illustrating the manner in which a dividing step is being carried out.
Figure 7:
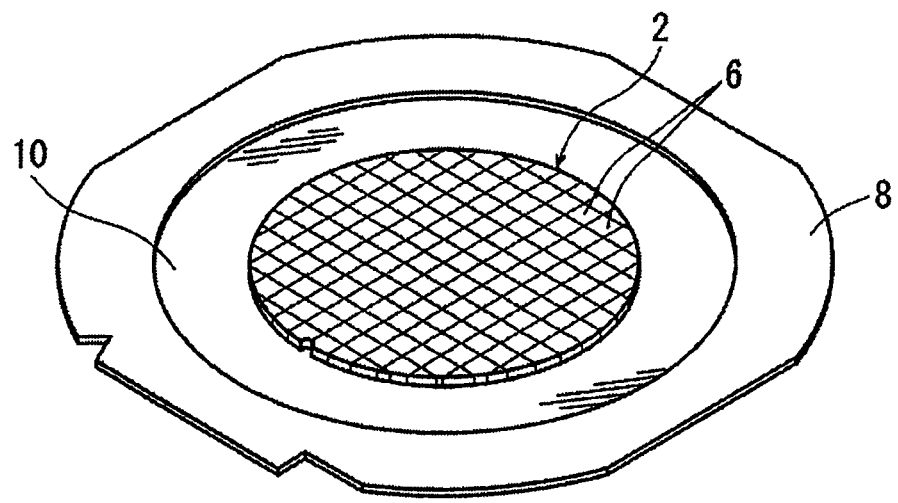
FIG. 7 is a perspective view the wafer that has been divided into individual device chips along projected dicing lines thereon.

After the shield tunnel forming step, a dividing step is carried out to etch the shield tunnels 56 according plasma etching to divide the wafer 2 into device chips that support the respective individual devices 6. The dividing step will be described in detail below with reference to FIG. 6. The dividing step is carried out using a known etching apparatus, not depicted. In the dividing step, the wafer 2 with the shield tunnels 56 formed therein is placed in a chamber of the etching apparatus, and then the chamber is evacuated, after which an etching gas such as sulfur hexafluoride ($SF_6$) or the like is introduced into the chamber and a plasma is generated in the chamber using a high-frequency power supply. The shield tunnels 56 formed in the wafer 2 along the grid of projected dicing lines 4 are removed by plasma etching, dividing the wafer 2 into individual device chips with the respective devices 6 supported on their face sides as depicted in FIG. 7.

The wafer processing method according to the present embodiment, as described above, includes the protective member placing step of placing the protective member on the face side 2a of the wafer 2, the shield tunnel forming step of applying the pulsed laser beam LB, which has the wavelength that is transmittable through single-crystal silicon, to the area corresponding to the projected dicing line 4 from the reverse side 2b of the wafer 2, thereby successively forming a plurality of shield tunnels 56 in the wafer 2, each made up of the fine pore 52 extending from the reverse side 2b to the face side 2a of the wafer 2 and the amorphous region 54 surrounding the fine pore 52, and the dividing step of dividing the wafer 2 into individual device chips by etching the shield tunnels 56 according to plasma etching. Since the wavelength of the pulsed laser beam LB used in the shield tunnel forming step is set to 1950 nm or higher, proper shield tunnels 56 can be formed in the wafer 2 along the projected dicing lines 4. Since the amorphous region 54 surrounding each of the fine pores 52 of the shield tunnels 56 has a higher etching rate than the single-crystal silicon which the substrate of the wafer 2 is made of, the shield tunnels 56 formed along the grid of projected dicing lines 4 are etched by a combination of shield tunnel formation and plasma etching, thereby dividing the wafer 2 into individual device chips having the respective devices 6 supported on their face sides. The device chips have a high flexural strength. Even if a metal film of TEG or the like or a low-k film is deposited on the upper surfaces of the projected dicing lines 4, a number of fine pores are formed as perforations in the metal film or the low-k film in the shield tunnel forming step. Therefore, when external forces are applied to the wafer 2 by suitable external force applying means such as a tape expanding device for expanding the protective tape 10 to which the wafer 2 is stuck, the metal film or the low-k film is severed along the fine pores in the form of perforations, so that the wafer 2 can be divided into individual device chips having the respective devices 6 supported on their face sides.

Conditions for a laser beam capable of forming proper shield tunnels in a single-crystal silicon wafer will be described below based on experiments conducted by the inventor of the present invention. Since a single-crystal silicon wafer has a radiation transmissivity of approximately 55% with respect to infrared rays in a predetermined wavelength range, if attempts are made to form shield tunnels in the single-crystal silicon wafer using a laser beam having a wavelength of 1030 nm at an end of the optical absorption spectrum of single-crystal silicon, it is considered that the laser beam is absorbed by the single-crystal silicon wafer, preventing proper shield tunnels from being formed therein, though modified layers are formed in the single-crystal silicon wafer by the laser beam that is partly transmitted therethrough. The inventor conducted experiments in which the wavelength of the laser beam was increased stepwise nearly from the end of the optical absorption spectrum of single-crystal silicon.

Experiment 1

In order to find a laser beam wavelength capable of forming proper shield tunnels in a single-crystal silicon wafer, the inventor applied a pulsed laser beam to the single-crystal silicon wafer while positioning the focused spot of the pulsed laser beam within the single-crystal silicon wafer and moving the single-crystal silicon wafer and the focused spot relatively to each other at a predetermined feed speed, under the conditions described below. As the refractive index n of single-crystal silicon is of approximately 3.7, the numerical aperture NA of the condensing lens was set to 0.5 so that $S=NA/n=NA/3.7=0.135$ within the range of $0.05 \leq S \leq 0.2$ in view of the experiment disclosed in Japanese Patent Laid-open No. 2014-221483.

Thickness of the single-crystal silicon wafer:
700 μm
Wavelength of the pulsed laser beam:
1034 to 2200 nm
Numerical aperture NA of the condensing lens:
0.5
Average output power: 3 W
Repetitive frequency: 50 kHz
Pulse duration: 10 nanoseconds
Feed speed: 500 mm/second

[Results of Experiment 1]

| Wavelength of the pulsed laser beam (nm) | Quality assessment of shield tunnels |
|---|---|
| 1034 | Poor |
| 1064 | Poor |
| 1300 | Poor |
| 1900 | Slightly good |
| 1950 | Good |
| 2000 | Good |
| 2100 | Good |
| 2200 | Good |

[Conclusion Based on Experiment 1]

It is understood from the results of Experiment 1 that the wavelength of the pulsed laser beam capable of forming proper shield tunnels in the single-crystal silicon wafer is of 1950 nm or higher in a range in which the pulsed laser beam is transmittable through the single-crystal silicon wafer. Up to a wavelength of approximately 6000 nm, as the radiation transmittivity of single-crystal silicon is of approximately 55% (see FIG. 3) as with the above wavelength range for forming good shield tunnels, it is considered that good shield tunnels can be formed in the single-crystal silicon wafer.

Experiment 2

In order to find a relation between the refractive index n of single-crystal silicon and the numerical aperture NA of the condensing lens for forming proper shield tunnels in a single-crystal silicon wafer, the inventor applied a pulsed laser beam to the single-crystal silicon wafer while positioning the focused spot of the pulsed laser beam within the single-crystal silicon wafer and moving the single-crystal silicon wafer and the focused spot relatively to each other at a predetermined feed speed, under the conditions described below.

Thickness of the single-crystal silicon wafer:
700 μm
Wavelength of the pulsed laser beam:
1950 nm
Average output power: 3 W
Repetitive frequency: 50 kHz
Pulse duration: 10 nanoseconds
Feed speed: 500 mm/second

[Results of Experiment 2]

| Numerical apertures NA of the condensing lens | Quality assessment of shield tunnels | S (S = NA/n) |
|---|---|---|
| 0.05 | Poor | 0.014 |
| 0.1 | Poor | 0.027 |
| 0.15 | Poor | 0.041 |
| 0.2 | Good | 0.054 |
| 0.25 | Good | 0.068 |
| 0.3 | Good | 0.081 |
| 0.35 | Good | 0.095 |
| 0.4 | Good | 0.108 |
| 0.45 | Good | 0.122 |
| 0.5 | Good | 0.135 |
| 0.55 | Good | 0.149 |
| 0.6 | Good | 0.162 |
| 0.65 | Good | 0.176 |
| 0.7 | Good | 0.189 |
| 0.75 | Good | 0.203 |
| 0.8 | Poor | 0.216 |
| 0.9 | Poor | 0.243 |

[Conclusion Based on Experiment 2]

It is understood from the results of Experiment 2 that a relation between the refractive index n of single-crystal silicon and the numerical aperture NA of the condensing lens for forming proper shield tunnels in a single-crystal silicon wafer is represented by 0.05≤NA/n≤0.2.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A wafer processing method for dividing a wafer including a single-crystal silicon substrate having on a face side thereof a plurality of devices disposed in respective areas demarcated by a plurality of intersecting projected dicing lines, into individual device chips, the method comprising:
a protective member placing step of placing a protective member on the face side of the wafer;
a shield tunnel forming step of, after performing the protective member placing step, applying a laser beam, which has a wavelength that is transmittable through single-crystal silicon, to areas of the wafer that correspond to the projected dicing lines from a reverse side of the wafer, thereby successively forming a plurality of shield tunnels in the wafer, each including a fine pore extending from the reverse side to the face side of the wafer and an amorphous region surrounding the fine pore; and
a dividing step of, after performing the shield tunnel forming step, dividing the wafer into individual device chips by etching the shield tunnels according to plasma etching,
wherein the pulsed laser beam used in the shield tunnel forming step has a wavelength of 1950 nm or higher.

2. The wafer processing method according to claim 1, wherein, in the shield tunnel forming step, the pulsed laser beam is focused by a condensing lens having a numerical aperture set such that a value calculated by dividing the numerical aperture of the condensing lens by the refractive index of single-crystal silicon is in a range of 0.05 to 0.2.

3. A wafer processing method for dividing a wafer including a single-crystal silicon substrate having on a face side thereof a plurality of devices disposed in respective areas demarcated by a plurality of intersecting projected dicing lines, into individual device chips, wherein the single-crystal silicon substrate includes a metal film of a test element group deposited on the projected dicing lines, the method comprising:
a protective member placing step of placing a protective member on the face side of the wafer;
a shield tunnel forming step of, after performing the protective member placing step, applying a laser beam, which has a wavelength that is transmittable through single-crystal silicon, to areas of the wafer that correspond to the projected dicing lines from a reverse side of the wafer, thereby successively forming a plurality of shield tunnels in the wafer, each including a fine pore extending from the reverse side to the face side of the wafer and an amorphous region surrounding the fine pore;
a dividing step of, after performing the shield tunnel forming step, dividing the wafer into individual device chips by etching the shield tunnels according to plasma etching; and
an external force applying step of using a tape expanding device to apply an external force to the wafer to sever the metal film along perforations formed therein during the shield tunnel forming step,
wherein the pulsed laser beam used in the shield tunnel forming step has a wavelength of 1950 nm or higher.

4. The wafer processing method according to claim 3, wherein, in the shield forming step, the pulsed laser beam is focused by a condensing lens having a numerical aperture set such that a value calculated by dividing the numerical aperture of the condensing lens by the refractive index of single-crystal silicon is in a range of 0.05 to 0.2.

5. A wafer processing method for dividing a wafer including a single-crystal silicon substrate having on a face side thereof a plurality of devices disposed in respective areas demarcated by a plurality of intersecting projected dicing lines, into individual device chips, wherein the single-crystal silicon substrate includes a low-k film deposited on the projected dicing lines, the method comprising:
a protective member placing step of placing a protective member on the face side of the wafer;
a shield tunnel forming step of, after performing the protective member placing step, applying a laser beam, which has a wavelength that is transmittable through single-crystal silicon, to areas of the wafer that correspond to the projected dicing lines from a reverse side of the wafer, thereby successively forming a plurality of shield tunnels in the wafer, each including a fine pore extending from the reverse side to the face side of the wafer and an amorphous region surrounding the fine pore;
a dividing step of, after performing the shield tunnel forming step, dividing the wafer into individual device chips by etching the shield tunnels according to plasma etching; and
an external force applying step of using a tape expanding device to apply an external force to the wafer to sever the low-k film along perforations formed therein during the shield tunnel forming step,
wherein the pulsed laser beam used in the shield tunnel forming step has a wavelength of 1950 nm or higher.

6. The wafer processing method according to claim 5, wherein, in the shield forming step, the pulsed laser beam is focused by a condensing lens having a numerical aperture set such that a value calculated by dividing the numerical aperture of the condensing lens by the refractive index of single-crystal silicon is in a range of 0.05 to 0.2.

* * * * *